(12) United States Patent
Sasaki (10) Patent No.: US 11,799,459 B2
(45) Date of Patent: Oct. 24, 2023

(54) OSCILLATOR CIRCUIT

(71) Applicant: LAPIS TECHNOLOGY CO., LTD., Yokohama (JP)

(72) Inventor: Seiichiro Sasaki, Yokohama (JP)

(73) Assignee: LAPIS TECHNOLOGY CO., LTD., Yokohama (JP)

( * ) Notice: Subject to any disclaimer, the term of this patent is extended or adjusted under 35 U.S.C. 154(b) by 0 days.

(21) Appl. No.: 17/705,813

(22) Filed: Mar. 28, 2022

(65) Prior Publication Data

US 2022/0321110 A1    Oct. 6, 2022

(30) Foreign Application Priority Data

Mar. 31, 2021    (JP) .................................. 2021-59854

(51) Int. Cl.
| | |
|---|---|
| *H03K 4/502* | (2006.01) |
| *H03K 19/20* | (2006.01) |
| *H03K 3/354* | (2006.01) |
| *H03K 3/0231* | (2006.01) |
| *H03B 5/24* | (2006.01) |
| *H03K 3/03* | (2006.01) |
| *H03K 4/501* | (2006.01) |

(52) U.S. Cl.
CPC ............... *H03K 4/502* (2013.01); *H03B 5/24* (2013.01); *H03K 3/0231* (2013.01); *H03K 3/03* (2013.01); *H03K 3/354* (2013.01); *H03K 4/501* (2013.01); *H03K 19/20* (2013.01)

(58) Field of Classification Search
CPC .. H03K 3/0231; H03K 3/03; H03K 4/50–502; H03K 3/354; H03B 5/20; H03B 5/24
See application file for complete search history.

(56) References Cited

U.S. PATENT DOCUMENTS

2014/0368284 A1* 12/2014 Luo ...................... H03K 3/0231
                                                          331/111
2021/0111673 A1*  4/2021 Van der Cammen ... H03M 1/12

FOREIGN PATENT DOCUMENTS

JP          2013-046378 A      3/2013

OTHER PUBLICATIONS

Peter, Kenneth W. Integrated interface circuits for switched capacitor sensors. Diss. University of Edinburgh, 1991. (Year: 1991).*

* cited by examiner

*Primary Examiner* — Ryan Johnson
(74) *Attorney, Agent, or Firm* — Volentine, Whitt & Francos, PLLC (57)    ABSTRACT

An oscillator circuit includes a first comparator that outputs a first signal indicative of a comparison result between an input potential and a threshold, a second comparator that outputs a second signal indicative of a comparison result between an input potential and the threshold, a RS flip-flop circuit that receives the first signal and the second signal and outputs first and second oscillation signals, a first charge/discharge unit that charges and discharges a first capacitor based on the first oscillation signal, a second charge/discharge unit that charges and discharges a second capacitor based on the second oscillation signal, a first dummy switch controlled to be on and off according to the second oscillation signal and adding a predetermined capacity to a first node, and a second dummy switch controlled to be on and off according to the first oscillation signal and adding a predetermined capacity to a second node.

6 Claims, 5 Drawing Sheets

FIG. 1

| S | R | Q | QB | STATE |
|---|---|---|---|---|
| 0 | 0 | HELD | HELD | CURRENT STATE IS MAINTAINED |
| 0 | 1 | 0 | 1 | RESET |
| 1 | 0 | 1 | 0 | RESET IS CANCELED |
| 1 | 1 | 0 | 0 | ——— |

OSCILLATOR CIRCUIT

CROSS-REFERENCE TO RELATED APPLICATION

This application is based upon and claims the benefit of priority from the prior Japanese Patent Application No. 2021-059854 filed on Mar. 31, 2021, the entire contents of which are incorporated herein by reference.

BACKGROUND

1. Technical Field

The present invention relates to an oscillator circuit, especially a relaxation oscillator circuit using a comparator.

2. Description of the Related Art

As a clock generating circuit mounted on an LSI, a relaxation oscillator circuit that charges and discharges a capacitor to perform an oscillation operation has been used. The relaxation oscillator circuit has a problem of variation in frequency of a clock output from the circuit caused by variation in, for example, a power supply voltage and a temperature during a production process and an operation of a comparator, which compares voltages at both ends of the capacitor with a reference voltage. Therefore, there has been proposed a relaxation oscillator circuit whose object is to generate a clock having a constant frequency (for example, JP-A-2013-46378).

SUMMARY

The relaxation oscillator circuit of the related art performs current restriction using a constant current source to reduce variation in threshold of a comparator. However, with the configuration, when an output of the comparator is set to H (a high level), the current restriction works, and therefore time is required until the output of the comparator becomes H. The higher the power supply voltage is, the longer the required time is. As a result, a response delay of the comparator and a RS latch caused a problem of power supply voltage dependence of an oscillation frequency.

The present invention has been made in consideration of the problem, and an object of the present invention is to provide an oscillator circuit that allows reducing power supply voltage dependence of an oscillation frequency.

According to the present invention, an oscillator circuit comprises: a first voltage comparator that receives supply of a power supply voltage via a first constant current source, the first voltage comparator outputting a first signal of a logical level 0 when an electric potential input to an input terminal exceeds a threshold, the first voltage comparator outputting a first signal of a logical level 1 when an electric potential input to the input terminal is the threshold or less; a second voltage comparator that receives supply of the power supply voltage via a second constant current source, the second voltage comparator outputting a second signal of a logical level 0 when an electric potential input to an input terminal exceeds the threshold, the second voltage comparator outputting a second signal of a logical level 1 when an electric potential input to the input terminal is the threshold or less; a RS flip-flop circuit that receives an input of the first signal at a reset terminal and receives an input of the second signal at a set terminal, the RS flip-flop circuit outputting a first oscillation signal and a second oscillation signal that is an inversion of the first oscillation signal based on the first signal and the second signal; a first capacitor having one end coupled to a ground potential; a second capacitor having one end coupled to a ground potential; a first charge/discharge unit that includes a first conductivity type first transistor and a second conductivity type second transistor, the first transistor and the second transistor having respective drains coupled to one another, the first transistor and the second transistor being coupled to another end of the first capacitor and an input end of the first voltage comparator via a first node and complementary turning on and off according to the first oscillation signal, the first charge/discharge unit charging and discharging the first capacitor based on the first oscillation signal; a second charge/discharge unit that includes a first conductivity type third transistor and a second conductivity type fourth transistor, the third transistor and the fourth transistor having respective drains coupled to one another, the third transistor and the fourth transistor being coupled to another end of the second capacitor and an input end of the second voltage comparator via a second node and complementary turning on and off according to the second oscillation signal, the second charge/discharge unit charging and discharging the second capacitor based on the second oscillation signal; a first dummy switch coupled to the first node, controlled to be on and off according to a signal level of the second oscillation signal, and adding a predetermined capacity to the first node during an on state; and a second dummy switch coupled to the second node, controlled to be on and off according to a signal level of the first oscillation signal, and adding a predetermined capacity to the second node during an on state.

The oscillator circuit according to the present invention allows reducing power supply voltage dependence of an oscillation frequency.

BRIEF DESCRIPTION OF THE DRAWINGS

Features of the present invention will be described below with reference to the accompanying drawings.

DETAILED DESCRIPTION

Preferred embodiments of the present invention will be described in detail below. Note that the same reference numerals are given to substantially the same or equivalent parts in the description in the following respective embodiments and the accompanying drawings.

Embodiment 1

Figure 1:
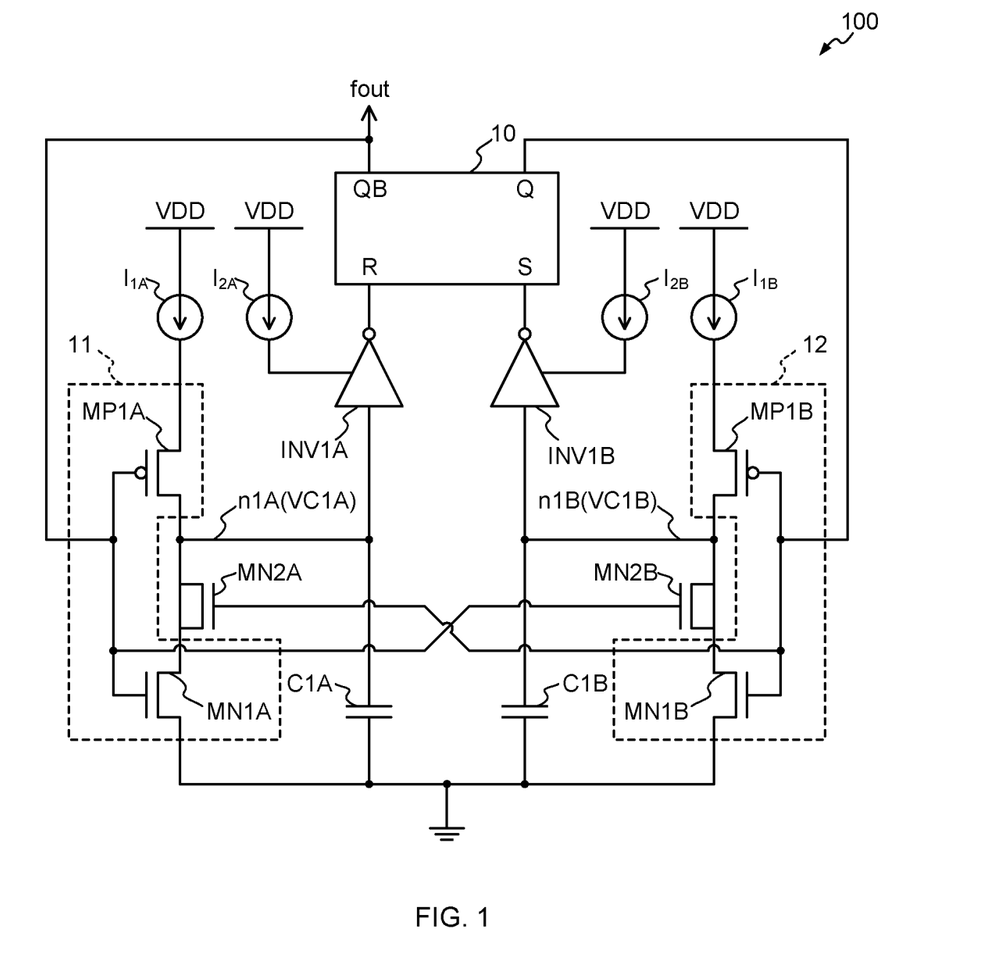
FIG. 1 is a circuit diagram illustrating a configuration of an oscillator circuit according to Embodiment 1 of the present invention.

FIG. 1 is a circuit diagram illustrating a configuration of an oscillator circuit 100 according to Embodiment 1 of the present invention. The oscillator circuit 100 includes a RS flip-flop circuit 10, a first inverter INV1A, a second inverter INV1B, a first capacitor C1A, a second capacitor C1B, a constant current source I1A, a constant current source I2A, a constant current source I1B, a constant current source I2B, a transistor MP1A, a transistor MN1A, a transistor MP1B, a transistor MN1B, a dummy switch MN2A, and a dummy switch MN2B.

The RS flip-flop circuit 10 receives inputs of an output signal from the inverter INV1A and an output signal from the inverter INV1B at a reset terminal R and a set terminal S, respectively, and outputs signals from an output terminal Q and an output terminal QB. The output from the output terminal QB is output to outside the oscillator circuit 100 as an oscillation signal fout. The oscillation signal fout is a binary signal whose signal level changes to a logical level 0 and a logical level 1. The output signal from the output terminal Q is a signal that changes to the logical level 0 and the logical level 1 in a reverse phase to the oscillation signal fout. That is, the signal having the signal level that is the inversion of the oscillation signal fout is output from the output terminal Q.

Figure 2:
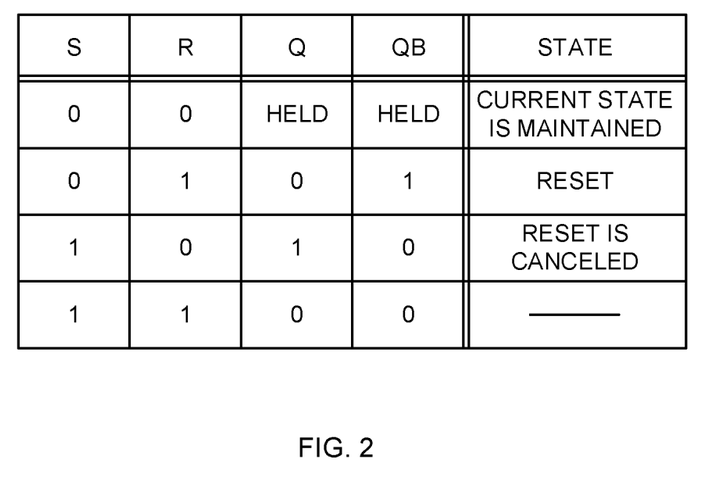
FIG. 2 is a drawing illustrating a truth table of a RS flip-flop circuit.

FIG. 2 is a table showing a truth table of the RS flip-flop circuit 10. When both inputs of the set terminal S and the reset terminal R are in the logical level 0, the outputs from the output terminal Q and the output terminal QB are maintained at the current state. When the input to the set terminal S is the logical level 0 and the input to the reset terminal R is the logical level 1, the signal of the logical level 0 is output from the output terminal Q and the signal of the logical level 1 is output from the output terminal QB. When the input to the set terminal S is the logical level 1 and the input to the reset terminal R is the logical level 0, the signal of the logical level 1 is output from the output terminal Q and the signal of the logical level 0 is output from the output terminal QB.

Referring to FIG. 1 again, the first inverter INV1A has an input end coupled to a node n1A and an output end coupled to the reset terminal R of the RS flip-flop circuit 10. The first inverter INV1A has a function as a comparator. When an electric potential level of the input signal, namely, an electric potential VC1A of the node n1A exceeds a threshold Th, the first inverter INV1A outputs an inverted signal, which is an inverted input signal. The output signal is input to the reset terminal R of the RS flip-flop circuit 10 as a reset signal.

Through supply of a power supply voltage VDD via the constant current source I2A, the first inverter INV1A performs an operation. Since the constant current source I2A is inserted into a supply line of the power supply voltage VDD, current restriction is performed on the supply of the power supply voltage VDD. Thus, variation in the threshold Th due to variation of the power supply voltage VDD is suppressed.

The second inverter INV1B has an input end coupled to a node n1B and an output end coupled to the set terminal S of the RS flip-flop circuit 10. The second inverter INV1B has a function as a comparator. When an electric potential level of the input signal, namely, an electric potential VC1B of the node n1B exceeds the threshold Th, the second inverter INV1B outputs an inverted signal, which is an inverted input signal. The output signal is input to the set terminal S of the RS flip-flop circuit 10 as a set signal.

Through supply of the power supply voltage VDD via the constant current source I2B, the second inverter INV1B performs an operation. Since the constant current source I2B is inserted into a supply line of the power supply voltage VDD, current restriction is performed on the supply of the power supply voltage VDD. Thus, variation in the threshold Th due to variation of the power supply voltage VDD is suppressed.

A transistor MP1A and a transistor MN1A are a pair of transistors constituting a charge/discharge unit 11 that charges and discharges the capacitor C1A. The transistor MP1A is constituted of a P channel MOSFET. The transistor MN1A is constituted of an N channel MOSFET. The transistor MP1A and the transistor MN1A have configurations of CMOS switches and are controlled to be complementary turned on and off.

The power supply voltage VDD is supplied to a source of the transistor MP1A via the constant current source I1A. A ground potential is supplied to a source of the transistor MN1A. A drain of the transistor MP1A and a drain of the transistor MN1A are coupled to one another.

Respective gates of the transistor MP1A and the transistor MN1A are coupled to one another and receive application of the oscillation signal fout output from the output terminal QB of the RS flip-flop circuit 10. When the oscillation signal fout is the logical level 0 (namely, the L level), the transistor MP1A turns on and the transistor MN1A turns off. On the other hand, when the oscillation signal fout is the logical level 1 (namely, the H level), the transistor MP1A turns off and the transistor MN1A turns on.

The transistor MP1B and the transistor MN1B are a pair of transistors constituting a charge/discharge unit 12 that charges and discharges the capacitor C1B. The transistor MP1B is constituted of a P channel MOSFET. The transistor MN1B is constituted of an N channel MOSFET. The transistor MP1B and the transistor MN1B have configurations of CMOS switches and are controlled to be complementary turned on and off.

The power supply voltage VDD is supplied to a source of the transistor MP1B via the constant current source I1B. A ground potential is supplied to a source of the transistor MN1B. A drain of the transistor MP1B and a drain of the transistor MN1B coupled to one another.

Respective gates of the transistor MP1B and the transistor MN1B are coupled to one another and receive application of the signal output from the output terminal Q of the RS flip-flop circuit 10. When the output signal from the output terminal Q is the logical level 0 (namely, the L level), the transistor MP1B turns on and the transistor MN1B turns off. On the other hand, when the output signal from the output terminal Q is the logical level 1 (namely, the H level), the transistor MP1B turns off and the transistor MN1B turns on.

One end of the capacitor C1A is coupled to the node n1A and the other end is grounded. The capacitor C1A is charged and discharged by on and off of the CMOS switches formed of the transistor MP1A and the transistor MN1A. In a state where the transistor MP1A is on and the transistor MN1A is off, the constant current from the constant current source I1A is supplied to the capacitor C1A via the node n1A to charge the capacitor C1A. In a state where the transistor MP1A is off and the transistor MN1A is on, the capacitor C1A is discharged via a ground line. Charging the capacitor C1A increases the electric potential of the node n1A. Discharging the capacitor C1A reduces the electric potential of the node n1A.

One end of the capacitor C1B is coupled to the node n1B and the other end is grounded. The capacitor C1B is charged and discharged by on and off of the CMOS switches formed of the transistor MP1B and the transistor MN1B. In a state where the transistor MP1B is on and the transistor MN1B is off, the constant current from the constant current source I1B is supplied to the capacitor C1B via the node n1B to charge the capacitor C1B. In a state where the transistor MP1B is off and the transistor MN1B is on, the capacitor C1B is discharged via a ground line. Charging the capacitor C1B increases the electric potential of the node n1B. Discharging the capacitor C1B reduces the electric potential of the node n1B.

The dummy switch MN2A is constituted of an N channel MOSFET whose source and drain are coupled to one another. The source and the drain of the dummy switch MN2A are coupled to respective drains of the transistors MP1A and MN1A and further coupled to the node n1A. The gate of the dummy switch MN2A is coupled to the output terminal Q of the RS flip-flop circuit 10 together with the gates of the transistors MP1B and MN1B and receives application of the output signal from the output terminal Q.

When the output signal from the output terminal Q of the RS flip-flop circuit 10 is the logical level 1, the dummy switch MN2A turns on, and when the output signal from the output terminal Q is the logical level 0, the dummy switch MN2A turns off. The output signal from the output terminal Q is a signal in the reverse phase to the oscillation signal fout from the output terminal QB. Accordingly, the dummy switch MN2A is controlled to be on and off in the reverse phase to the transistor MN1A that receives application of the oscillation signal fout.

When the dummy switch MN2A turns on, a capacity of the transistor constituting the dummy switch MN2A is added to the node n1A. Thus, the rise in the electric potential VC1A of the node n1A starts according to the charge of the capacitor C1A from the state in which a voltage by the capacity is added.

The dummy switch MN2B is constituted of an N channel MOSFET whose source and drain are coupled to one another. The source and the drain of the dummy switch MN2B are coupled to respective drains of the transistors MP1B and MN1B and further coupled to the node n1B. The gate of the dummy switch MN2B is coupled to the output terminal QB of the RS flip-flop circuit 10 together with the gates of the transistors MP1A and MN1A and receives application of the oscillation signal fout.

When the oscillation signal fout is the logical level 1, the dummy switch MN2B turns on, and when the oscillation signal fout is the logical level 0, the dummy switch MN2B turns off. The oscillation signal fout is a signal in the reverse phase to the output signal from the output terminal Q. Accordingly, the dummy switch MN2B is controlled to be on and off in the reverse phase to the transistor MN1B that receives application of the output signal from the output terminal Q.

When the dummy switch MN2B turns on, a capacity of the transistor constituting the dummy switch MN2B is added to the node n1B. Thus, the rise in the electric potential VC1B of the node n1B starts according to the charge of the capacitor C1B from the state in which a voltage by the capacity is added.

Next, the operation of the oscillator circuit 100 of this embodiment will be described.

Figure 3:
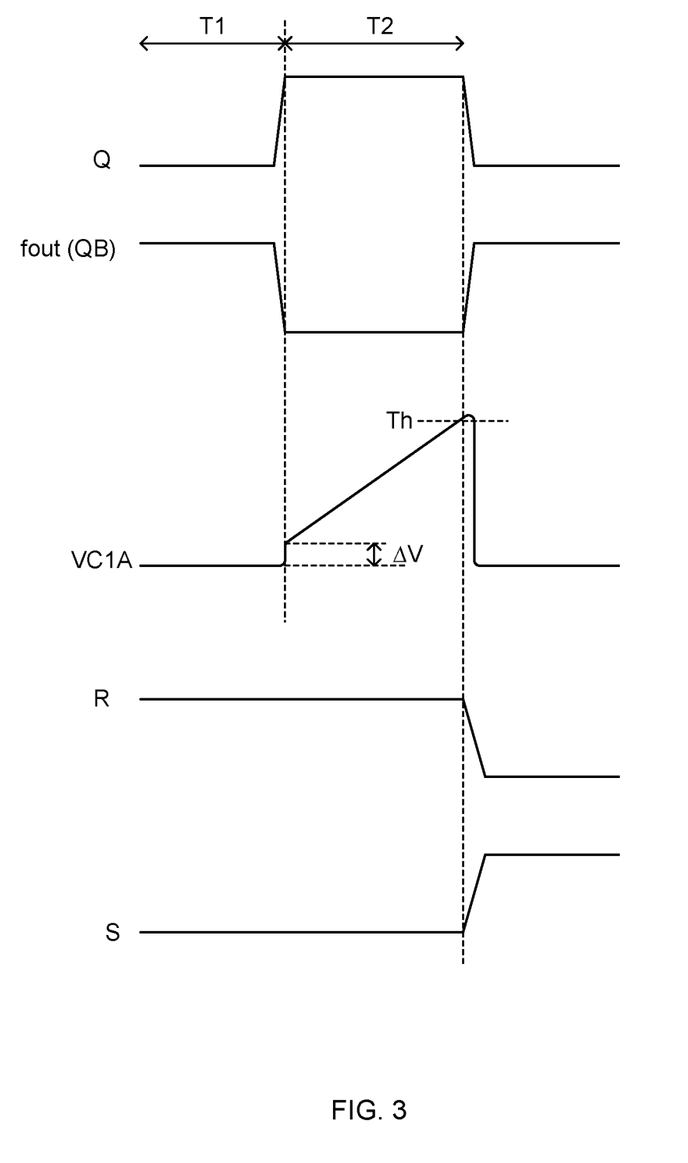
FIG. 3 is a timing chart illustrating a change in each signal and a change in electric potential in the oscillator circuit of Embodiment 1.

FIG. 3 is a timing chart illustrating a relationship between a change in the signal level of the oscillation signal fout and a change in the voltage level of the electric potential VC1A of the node n1A.

In a period T1 during which the oscillation signal fout is the logical level 1, the transistor MP1A turns off and the transistor MN1A turns on. Since the transistor MN1A is on, the capacitor C1A is discharged and enters a reset state. The electric potential VC1A of the node n1A becomes a ground potential level, namely, the L level, according to this.

When the oscillation signal fout becomes the logical level 0, the transistor MP1A turns on and the transistor MN1A turns off Thus, a current I1 from the constant current source I1A is supplied to the capacitor C1A via the transistor MP1A and the node n1A and charge of the capacitor C1A starts.

Then, the output signal from the output terminal Q becomes the logical level 1 and is applied to the dummy switch MN2A. The dummy switch MN2A turns on, and a voltage by the capacity of the dummy switch MN2A is added to the electric potential VC1A of the node n1A. Accordingly, in a period T2 illustrated in FIG. 3, the electric potential VC1A of the node n1A has an initial state in which the electric potential VC1A is higher than a set electric potential by the voltage for the capacity of the dummy switch MN2A (indicated by ΔV in the drawing), and the voltage level rises according to the charge of the capacitor C1A.

When the voltage level of the electric potential VC1A of the node n1A exceeds the threshold Th, the inverter INV1A outputs a signal of the logical level 0. The signal of the logical level 0 is supplied to the reset terminal R of the RS flip-flop circuit 10.

On the other hand, the transistor MP1B, the transistor MN1B, and the dummy switch MN2B turn on and off by operations in the reverse phases, in other words, a half phase delay, to operations of the above-described transistor MP1A, transistor MN1A, and dummy switch MN2A, respectively. Thus, the capacitor C1B is discharged and the electric potential VC1B of the node n1B becomes the L level. The inverter INV1B outputs the signal of the logical level 1. A logical level 1n signal is supplied to the set terminal S of the RS flip-flop circuit 10. The RS flip-flop circuit 10 outputs the oscillation signal fout of the logical level 1.

Thus, with the oscillator circuit 100 of this embodiment, the dummy switch MN2A is controlled to be on and off in the reverse phase to the transistor MN1A, thus generating what is called charge injection effect. The charge injection effect increases the initial value ΔV during the voltage rise, namely, during charge, of the electric potential VC1A of the node n1A.

This initial value ΔV increases in proportion to the voltage value of the power supply voltage VDD. In view of this, the larger the magnitude of the voltage value of the power supply voltage VDD is, the shorter the time required for the electric potential VC1A of the node n1A to exceed the threshold Th of the comparator INV1A is. Hereinafter, in the following description, this will be referred to as shortening of voltage rise time.

Due to the shortening of voltage rise time, the oscillator circuit 100 of this embodiment allows offsetting a response delay of the comparator and the RS flip-flop circuit and reducing power supply voltage dependence of an oscillation frequency.

That is, with the configuration including the constant current sources I2A and I2B in the supply line of the power supply voltage VDD, due to current restriction, a timing at which the outputs from the comparators INV1A and INV1B become the H level from the L level delays, thus causing a response delay of the comparators INV1A and INV1B and the RS flip-flop circuit 10. Then, the larger the voltage value of the power supply voltage VDD is, the larger an amount of delay of the response delay is. In view of this, with the configuration that does not include the dummy switch MN2A or MN2B as in this embodiment, power supply voltage dependence occurs in the oscillation frequency.

In contrast to this, with oscillator circuit 100 of this embodiment, shortening the time required for the electric potential VC1A to exceed the threshold Th allows offsetting the response delay of the comparator and the RS flip-flop. Additionally, while the response delay of the comparator and the RS flip-flop are proportionate to the power supply voltage VDD, the time required for the electric potential VC1A to exceed the threshold Th is inversely proportional to the power supply voltage VDD. Therefore, the power supply voltage dependence of the oscillation frequency can be reduced.

As described above, the oscillator circuit 100 of this embodiment allows reducing the power supply voltage dependence of the oscillation frequency.

Embodiment 2

Figure 4:
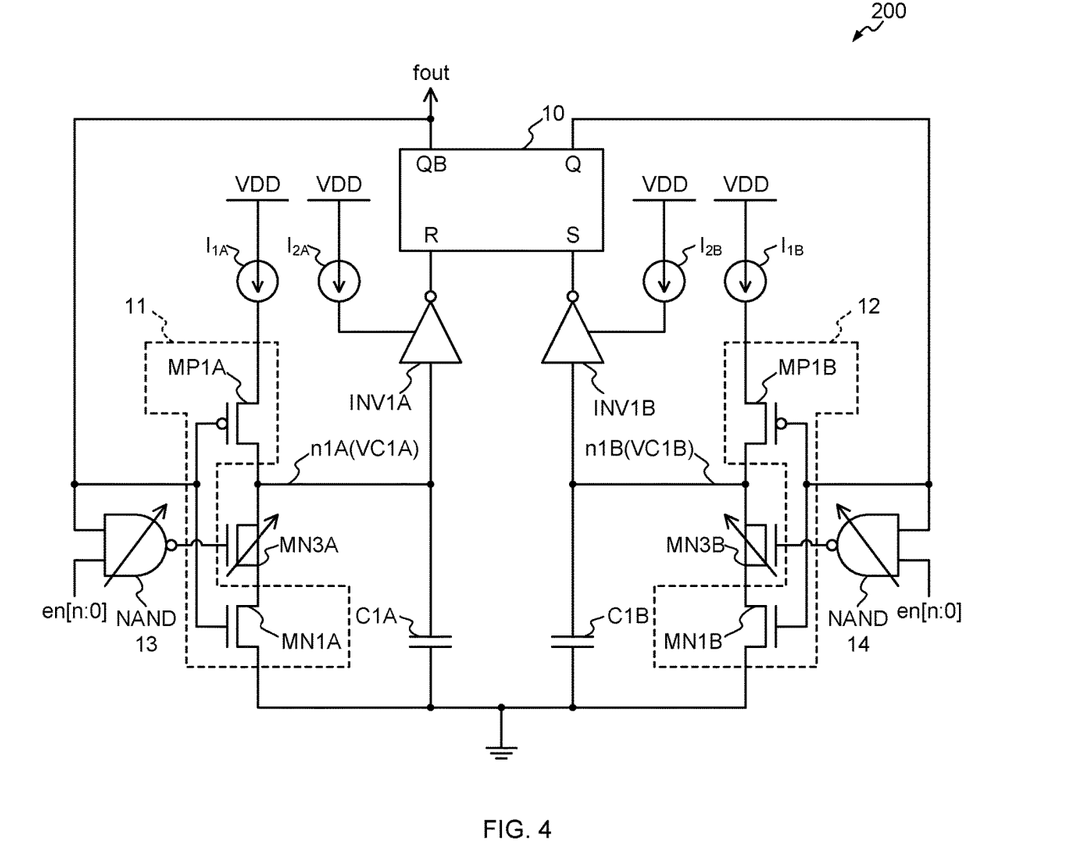
FIG. 4 is a circuit diagram illustrating a configuration of an oscillator circuit according to Embodiment 2 of the present invention.

Next, Embodiment 2 of the present invention will be described. An oscillator circuit of Embodiment 2 differs from the oscillator circuit of Embodiment 1 in the configuration and the operation of the dummy switch.

FIG. 4 is a circuit diagram illustrating a configuration of an oscillator circuit 200 according to Embodiment 2 of the present invention. The oscillator circuit 200 includes a dummy switch MN3A, a dummy switch MN3B, a NAND gate 13, and a NAND gate 14.

The dummy switch MN3A is constituted of a plurality of N channel MOSFETs whose sources and drains are coupled to one another. The plurality of N channel MOSFETs receive application of the output signal from the NAND gate 13 and are controlled to be on and off according to this.

Figure 5:
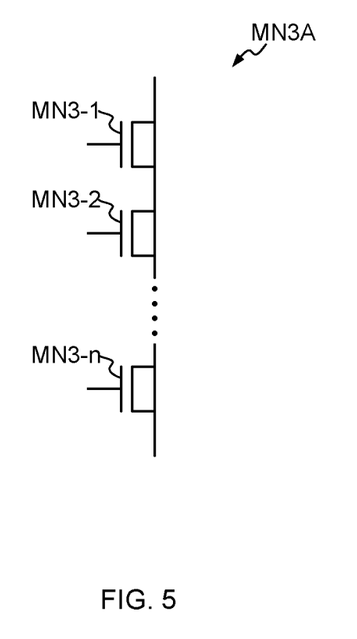
FIG. 5 is a drawing illustrating a configuration of a variable capacity unit in the oscillator circuit of Embodiment 2.

FIG. 5 is a circuit diagram illustrating a configuration of the dummy switch MN3A. The dummy switch MN3A has a configuration in which transistors MN3-1, MN3-2 . . . MN3-$n$ as n pieces N channel MOSFETs are coupled in cascade (n is an integer of 2 or more). The transistors MN3-1 to MN3-$n$ are controlled to be selectively on and off through application of output signals from the NAND gates 13 to the respective gates.

Referring to FIG. 4 again, the NAND gate 13 has a first input end coupled to the output terminal QB of the RS flip-flop circuit 10 to receive the input of the oscillation signal fout. Additionally, an enable signal en is input to a second input end of the NAND gate 13. The NAND gate 13 outputs a signal of non-conjunction of the oscillation signal fout and the enable signal en.

The dummy switch MN3B has a configuration similar to the dummy switch MN3A. That is, the dummy switch MN3B is constituted of a plurality of N channel MOSFETs whose sources and drains are coupled to one another, and is controlled to be on and off according to the reception of application of the output signal from the NAND gate 14.

The NAND gate 14 has a first input end coupled to the output signal from the output terminal Q of the RS flip-flop circuit 10. Additionally, the enable signal en is input to a second input end of the NAND gate 14. The NAND gate 14 outputs a signal of non-conjunction of the output signal from the output terminal Q and the enable signal en.

The enable signal en functions as a selection signal to select a transistor target for control of on and off by signal supply from the RS flip-flop circuit 10 among the plurality of transistors constituting the respective dummy switches MN3A and MN3B.

For example, when the enable signal en to select only the transistor MN3-1 among the transistors constituting the dummy switch MN3A is supplied to the NAND gate 13, the NAND gate 13 outputs a signal to control the transistor MN3-1 to be on and off in the reverse phase to the oscillation signal fout. The signal is supplied to the gate of the transistor MN3-1. Since the same enable signal en is supplied to the NAND gate 14, by the output signal of the NAND gate 14, among the plurality of transistors constituting the dummy switch MN3B, the transistor corresponding to the transistor MN3-1 is selectively controlled to be on and off. Note that when the enable signal en is set to the L level, the gates of the dummy switch MN3A and the dummy switch MN3B are fixed, and capacitance values added to the node n1A and the node n1B are fixed.

The dummy switch MN3A is controlled to be on and off in the reverse phase to the transistor MN1A. Accordingly, similarly to Embodiment 1, due to what is called charge injection effect, the initial value ΔV during the voltage rise (during charge) of the electric potential VC1A of the node n1A increases. Similarly, the dummy switch MN3B is controlled to be on and off in the reverse phase to the transistor MN1B, and the initial value ΔV during the voltage rise (during charge) of the electric potential VC1B of the node n1B increases. Similarly to Embodiment 1, this allows offsetting a response delay of the comparator and the RS flip-flop circuit and reducing the power supply voltage dependence of the oscillation frequency.

Additionally, with the oscillator circuit 200 of this embodiment, the supply of the enable signal en allows selecting the transistor controlled to be on and off according to the output signal from the RS flip-flop circuit 10. Accordingly, the oscillator circuit 200 according to this embodiment allows adjusting the initial value ΔV during the voltage rise of each of the nodes n1A and n1B according to the voltage value of the power supply voltage VDD. For example, adjustment at shipment of the oscillator circuit 200 as a product allows setting the initial value ΔV to an appropriate value and accurately reducing the power supply voltage dependence of the oscillation frequency.

The present invention is not limited to the embodiments. For example, in the embodiments, the configuration in which the electric potential of the node n1A and the electric potential of the node n1B are compared with the threshold Th using the first inverter INV1A and the second inverter INV1B and the reset signal and the set signal are output based on the comparison results has been described as an example. However, instead of the first inverter INV1A and the second inverter INV1B, the part may be configured using a comparator amplifier. That is, it is only necessary to function as a voltage comparator that compares the electric potential of each of the nodes with the threshold and outputs the signal of the logical level 0 when the electric potential exceeds the threshold and outputs the signal of the logical level 1 when the electric potential is the threshold or less.

In the embodiments, the case where the power supply voltage VDD is supplied to the charge/discharge unit 11 via the constant current source I1A and the power supply voltage VDD is supplied to the charge/discharge unit 12 via the constant current source I1B has been described as an example. However, the configuration is not limited to this, and the power supply voltage VDD may be supplied to the charge/discharge units 11 and 12 via a common constant current source.

In the embodiments, the case where the dummy switch is constituted of the N channel MOSFET has been described as an example. However, the configuration is not limited to this, and the dummy switch may be constituted of a P channel MOSFET and a capacitive element.

In the embodiments, the state in which the capacitors C1A and C1B are discharged is determined as the reset state. However, different from this, a configuration in which the charged state is determined as the reset state and the capacitors C1A and C1B are charged at a constant current may be employed.

Embodiment 2 has been described that the product can be adjusted at, for example, before shipment. However, for example, a configuration in which an adjustment unit that outputs the enable signal en based on the changes in the oscillation signal fout and the power supply voltage VDD is disposed outside the oscillator circuit 200 to ensure dynamic adjustment may be employed.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims.

What is claimed is:

1. An oscillator circuit comprising:
a first voltage comparator that receives supply of a power supply voltage via a first constant current source, the first voltage comparator outputting a first signal of a logical level 0 when an electric potential input to an input terminal of the first voltage comparator exceeds a threshold, the first voltage comparator outputting a first signal of a logical level 1 when the electric potential input to the input terminal of the first voltage comparator is equal to or less than the threshold;
a second voltage comparator that receives supply of the power supply voltage via a second constant current source, the second voltage comparator outputting a second signal of the logical level 0 when an electric potential input to an input terminal of the second voltage comparator exceeds the threshold, the second voltage comparator outputting a second signal of the logical level 1 when the electric potential input to the input terminal of the second voltage comparator is equal to or less than the threshold;
a RS flip-flop circuit that receives the first signal at a reset terminal and receives the second signal at a set terminal, the RS flip-flop circuit outputting a first oscillation signal, and a second oscillation signal that is an inversion of the first oscillation signal, based on the first signal and the second signal;
a first capacitor having one end coupled to a ground potential;
a second capacitor having one end coupled to a ground potential;
a first charge/discharge unit that includes a first conductivity type first transistor and a second conductivity type second transistor, the first transistor and the second transistor having respective drains coupled to one another, the first transistor and the second transistor being coupled to another end of the first capacitor and the input terminal of the first voltage comparator via a first node and complementary turning on and off according to the first oscillation signal, the first charge/discharge unit charging and discharging the first capacitor based on the first oscillation signal;
a second charge/discharge unit that includes a first conductivity type third transistor and a second conductivity type fourth transistor, the third transistor and the fourth transistor having respective drains coupled to one another, the third transistor and the fourth transistor being coupled to another end of the second capacitor and the input terminal of the second voltage comparator via a second node and complementary turning on and off according to the second oscillation signal, the second charge/discharge unit charging and discharging the second capacitor based on the second oscillation signal;
a first dummy switch provided between the first node and the second transistor, coupled to the first node, controlled to be on and off in phase with the fourth transistor according to a signal level of the second oscillation signal, and adding a predetermined capacity to the first node during an on state; and
a second dummy switch provided between the second node and the fourth transistor coupled to the second node, controlled to be on and off in phase with the second transistor according to a signal level of the first oscillation signal, and adding a predetermined capacity to the second node during an on state.

2. The oscillator circuit according to claim 1, wherein
the first dummy switch comprises a second conductivity type fifth transistor, the fifth transistor has a source and a drain coupled to one another and coupled to the first node, and the fifth transistor has a gate that receives application of the second oscillation signal, and
the second dummy switch comprises a second conductivity type sixth transistor, the sixth transistor has a source and a drain coupled to one another and coupled to the second node, and the sixth transistor has a gate that receives application of the first oscillation signal.

3. The oscillator circuit according to claim 1, wherein
the first voltage comparator comprises a first inverter, and the first inverter has an input end coupled to the first node, inverts a first comparison result of comparison between an electric potential of the first node and the threshold, and outputs the inverted first comparison result, and
the second voltage comparator comprises a second inverter, and the second inverter has an input end coupled to the second node, inverts a second comparison result of comparison between an electric potential of the second node and the threshold, and outputs the inverted second comparison result.

4. The oscillator circuit according to claim 1, wherein
the first charge/discharge unit receives application of the power supply voltage at a source of the first transistor via a first constant current source and supplies a current from the first constant current source to the first capacitor via the first node to charge the first capacitor; and
the second charge/discharge unit receives application of the power supply voltage at a source of the third transistor via a second constant current source and supplies a current from the second constant current source to the second capacitor via the second node to charge the second capacitor.

5. An oscillator circuit comprising:
a first voltage comparator that receives supply of a power supply voltage via a first constant current source, the first voltage comparator outputting a first signal of a logical level 0 when an electric potential input to an input terminal of the first voltage comparator exceeds a threshold, the first voltage comparator outputting a first signal of a logical level 1 when the electric potential input to the input terminal of the first voltage comparator is equal to or less than the threshold;
a second voltage comparator that receives supply of the power supply voltage via a second constant current source, the second voltage comparator outputting a second signal of the logical level 0 when an electric potential input to an input terminal of the second voltage comparator exceeds the threshold, the second voltage comparator outputting a second signal of the logical level 1 when the electric potential input to the input terminal of the second voltage comparator is equal to or less than the threshold;

a RS flip-flop circuit that receives the first signal at a reset terminal and receives the second signal at a set terminal, the RS flip-flop circuit outputting a first oscillation signal, and a second oscillation signal that is an inversion of the first oscillation signal, based on the first signal and the second signal;

a first capacitor having one end coupled to a ground potential;

a second capacitor having one end coupled to a ground potential;

a first charge/discharge unit that includes a first conductivity type first transistor and a second conductivity type second transistor, the first transistor and the second transistor having respective drains coupled to one another, the first transistor and the second transistor being coupled to another end of the first capacitor and the input terminal of the first voltage comparator via a first node and complementary turning on and off according to the first oscillation signal, the first charge/discharge unit charging and discharging the first capacitor based on the first oscillation signal;

a second charge/discharge unit that includes a first conductivity type third transistor and a second conductivity type fourth transistor, the third transistor and the fourth transistor having respective drains coupled to one another, the third transistor and the fourth transistor being coupled to another end of the second capacitor and the input terminal of the second voltage comparator via a second node and complementary turning on and off according to the second oscillation signal, the second charge/discharge unit charging and discharging the second capacitor based on the second oscillation signal;

a first dummy switch coupled to the first node, controlled to be on and off according to a signal level of the second oscillation signal, and adding a predetermined capacity to the first node during an on state; and a second dummy switch coupled to the second node, controlled to be on and off according to a signal level of the first oscillation signal, and adding a predetermined capacity to the second node during an on state, wherein the first dummy switch includes a plurality of second conductivity type transistors coupled in cascade, the second dummy switch includes another plurality of second conductivity type transistors coupled in cascade, each of the second conductivity type plurality of transistors of the first dummy switch has a source and a drain coupled to one another and has a gate that selectively receives application of a signal that is an inversion of the first oscillation signal, and each of the another plurality of second conductivity type transistors of the second dummy switch has a source and a drain coupled to one another and has a gate that selectively receives application of a signal that is an inversion of the second oscillation signal.

6. The oscillator circuit according to claim 5, comprising:

a first NAND gate that supplies a logical conjunction of a selection signal that selects any of the plurality of second conductivity type transistors of the first dummy switch and the first oscillation signal to the first dummy switch; and a second NAND gate that supplies a logical conjunction of another selection signal that selects any of the another plurality of second conductivity type transistors of the second dummy switch and the second oscillation signal to the second dummy switch.

* * * * *